US005495328A

United States Patent [19]
Spence et al.

[11] Patent Number: 5,495,328
[45] Date of Patent: *Feb. 27, 1996

[54] APPARATUS AND METHOD FOR CALIBRATING AND NORMALIZING A STEREOLITHOGRAPHIC APPARATUS

[75] Inventors: Stuart T. Spence, South Pasadena; Thomas A. Almquist, San Gabriel; Harry L. Tarnoff, Van Nuys; Warren Juran, Sylmar, all of Calif.

[73] Assignee: 3D Systems, Inc., Valencia, Calif.

[ * ] Notice: The term of this patent shall not extend beyond the expiration date of Pat. No. 5,123,734.

[21] Appl. No.: 160,078

[22] Filed: Nov. 30, 1993

Related U.S. Application Data

[63] Continuation-in-part of Ser. No. 772,575, Oct. 7, 1991, Pat. No. 5,267,013, which is a continuation of Ser. No. 268,816, Nov. 8, 1988, Pat. No. 5,058,998, which is a continuation-in-part of Ser. No. 182,830, Apr. 18, 1988, Pat. No. 5,059,359.

[51] Int. Cl.⁶ .............................. G01J 1/00; B28B 17/00
[52] U.S. Cl. ...................................... 356/121; 425/174.4
[58] Field of Search ..................... 356/121–123, 356/153, 237, 355, 356; 250/347, 239; 425/174, 174.1; 104/35; 204/22, 25, 40.1, 250, 308

[56] References Cited

U.S. PATENT DOCUMENTS

| | | | |
|---|---|---|---|
| 2,775,758 | 12/1956 | Munz | 156/58 X |
| 4,082,463 | 4/1978 | Dehait et al. | 356/387 |
| 4,320,462 | 3/1982 | Lund et al. | 364/525 |
| 4,423,437 | 12/1983 | Beck et al. | 358/113 |
| 4,498,767 | 2/1985 | McGovern et al. | 356/121 |
| 4,541,876 | 9/1985 | Hwang | 148/22 |
| 4,575,330 | 3/1986 | Hull | 425/174 |
| 4,585,342 | 4/1986 | Lin et al. | 356/124 |
| 4,660,981 | 4/1987 | Stridsberg | 356/398 |
| 4,695,722 | 9/1987 | Motooka | 250/347 |
| 4,745,280 | 5/1988 | Gi et al. | 250/347 |
| 4,752,498 | 6/1988 | Fudim | 425/174.4 |
| 4,799,791 | 1/1989 | Echizen et al. | 356/121 |
| 4,801,477 | 1/1989 | Fudim | 264/22 |
| 4,863,538 | 9/1989 | Deckard | 156/272.8 X |
| 4,929,402 | 5/1990 | Hull | 264/308 |
| 4,945,032 | 7/1990 | Murphy | 425/174 |
| 5,058,988 | 10/1991 | Spence | 356/121 |
| 5,059,021 | 10/1991 | Spence et al. | 356/121 |
| 5,123,734 | 6/1992 | Spence et al. | 356/121 |
| 5,133,987 | 7/1992 | Spence et al. | 356/121 |

FOREIGN PATENT DOCUMENTS

| | | |
|---|---|---|
| 52-26242 | 2/1977 | Japan . |
| 56-70429 | 6/1981 | Japan . |
| 0163933 | 7/1987 | Japan . |

OTHER PUBLICATIONS

T. Nakai and Y. Maratami, "Photopolymerization of Photo-polymers by Scanning Laser Beam," Reiza Kenkyu, vol. 16, No. 1, pp. 14–22, Jan. 1988. (English translation and copy of Japanese original).

P. J. Shalyer, "Laser Beam Distribution In the Focal Region," Applied Optics, vol. 17, No. 17, Sep. 1978, pp. 2673–2674.

H. Kodama, "Automatic Method for Fabricating a Three-Dimensional Plastic Model with Photo-Hardening Polymer," Review of Scientific Instruments, vol. 52, No. 11, Nov. 1981, pp. 1770–1773.

E. Fudim, "A New Method of Three-Dimensional Micro-machining," Mechanical Engineering, Sep. 1985, pp. 54–59.

Primary Examiner—Hoa O. Pham
Attorney, Agent, or Firm—Lyon & Lyon

[57] ABSTRACT

An apparatus and a method for calibrating and normalizing a stereolithographic apparatus so that a reaction means directed by a positioning means supplied with positioning means information may be positioned accurately on a designated surface of a working medium. One or more sensors fixed in location with respect to the designated surface of the working medium are utilized to correlate positioning means information with specific locations on the designated surface of the working medium. Other locations intermediate the specific locations may then be determined by the technique of linear interpolation.

22 Claims, 14 Drawing Sheets

CHAMBER ASSEMBLY (A)

ELECTRONIC CABINET ASSEMBLY (REAR VIEW) (B)

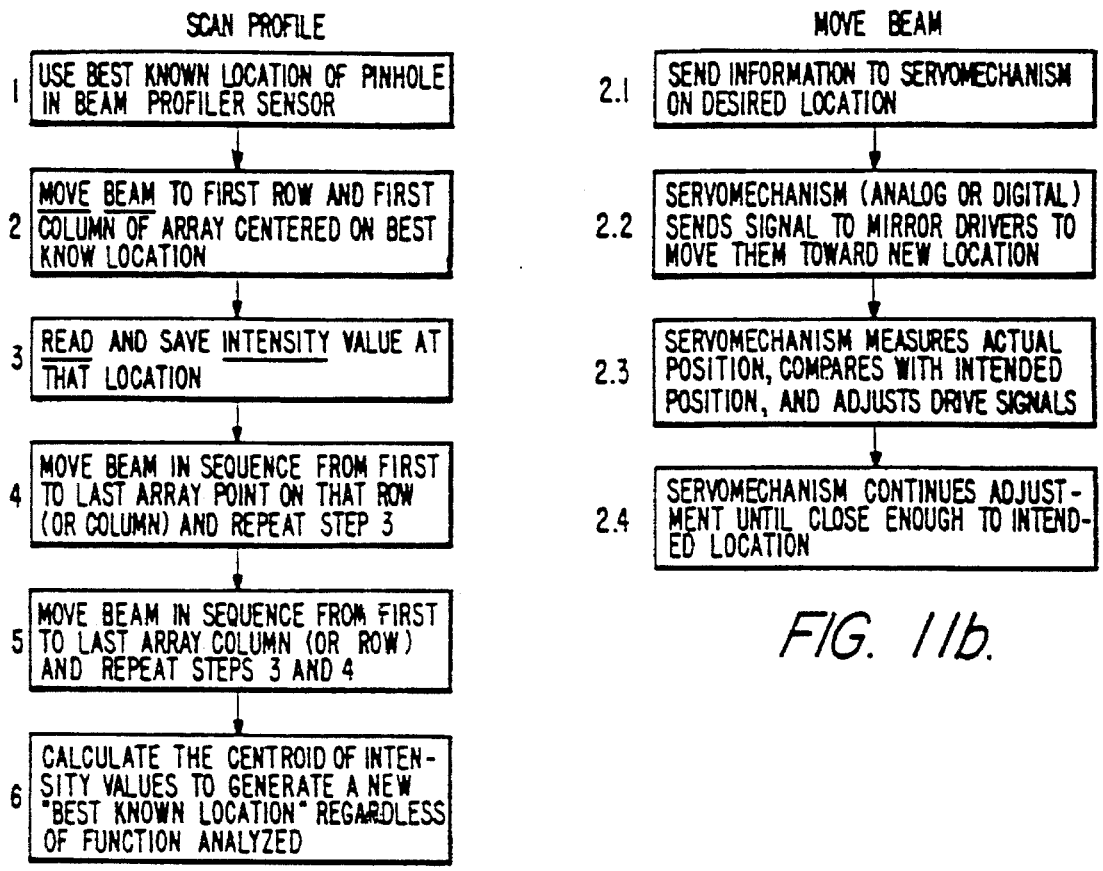
FIG. 11a.
FIG. 11b.
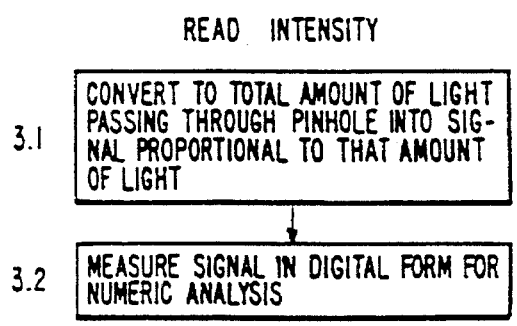
FIG. 11c.

APPARATUS AND METHOD FOR CALIBRATING AND NORMALIZING A STEREOLITHOGRAPHIC APPARATUS

RELATED APPLICATIONS

This is a continuation-in-part of U.S. patent application Ser. No. 07/772,575, filed Oct. 7, 1991, now U.S. Pat. No. 5,267,013; which is a continuation of U.S. patent application Ser. No. 07/268,816, filed Nov. 8, 1988, now U.S. Pat. No. 5,058,988; which is a continuation-in-part of U.S. patent application Ser. No. 07/182,830, filed Apr. 18, 1988, now U.S. Pat. No. 5,059,359 all incorporated herein by reference. Related U.S. patent application Ser. Nos. 07/182,823, filed Apr. 18, 1988, now abandoned; 07/183,016, now U.S. Pat. No. 4,996,010; 07/183,015, now U.S. Pat. No. 5,015,424; 07/182,801, now U.S. Pat. No. 4,999,143; 07/183,014, now abandoned; and 07/183,012, now abandoned, all filed Apr. 18, 1988, are incorporated herein by reference. Related U.S. patent application Ser. Nos. 07/268,837 and 07/268,907, both filed Nov. 8, 1988, now respectively U.S. Pat. Nos. 5,123,734 and 5,059,021, are also incorporated herein by reference.

BACKGROUND OF THE INVENTION

This invention relates generally to apparatus and methods for calibrating and normalizing a stereolithographic apparatus, particularly a stereolithographic apparatus where a positioning means such as a pair of computer-controlled mirrors are used to direct a reaction means upon a designated surface of a medium to solidify successive adjacent laminae forming an object.

In recent years, "stereolithography" systems, such as those described in U.S. Pat. No. 4,575,330 entitled "Apparatus For Production Of Three-dimensional Objects By Stereolithography," have come into use. The disclosure of U.S. Pat. No. 4,575,330 is hereby incorporated by reference, as if fully set forth herein. Basically, stereolithography is a method for automatically building complex plastic parts by successively printing cross-sections of photocurable polymer or the like on top of each other until all of the thin layers are joined together to form a whole part. With this technology, the parts are literally grown in a vat of liquid plastic. This method of fabrication is extremely powerful for quickly reducing design ideas to physical form and for making prototypes.

Photocurable polymers ("photopolymers") change from liquid to solid in the presence of light and their photospeed with ultraviolet light (UV) is fast enough to make them practical model building materials. The material that is not polymerized when a part is made is still usable and remains in the vat as successive parts are made. An ultraviolet laser may be used which generates a small intense spot of UV light. This spot is moved across the liquid surface with a galvanometer X-Y mirror scanner. The scanner is driven by computer generated vectors or the like. Precise and complex patterns can be rapidly produced with this technique.

The laser scanner, the photopolymer vat, and an elevator, along with a controlling computer, combine together to form a stereolithography apparatus, referred to as an "SLA." An SLA is programmed to automatically make a plastic part by "drawing" one cross-section at a time, and building it up layer by layer.

Stereolithography represents an unprecedented way to quickly make complex or simple parts without tooling. Since this technology depends on using a computer to generate its cross-sectional patterns, a natural data link to CAD/CAM exists.

To be effective, a stereolithography system must have information about the focus, laser beam oscillation mode, beam power, intensity distribution or profile, and scanning system drift of the drawing laser in order to carry out the accurate and efficient production of parts (objects made by stereolithography are known as "parts"). The beam must be in relative focus at the surface of the working photopolymer fluid. The laser mode, intensity distribution, and beam power are important to the depth and width of cure of the working fluid, as well as the scan speed. The "drift" of the scanning system must be measured and corrected periodically.

Beam profile (a profile of the intensity of the beam) measurements provide useful information about the beam because they can help accomplish the following purposes: 1. Focus optics and correct astigmatism and other aberrations; 2. Measure the power of the beam (needed on a day to day basis); 3. Study the laser mode and changes of the mode; 4. Compensate for drift of the laser scanning system; 5. Allow recording of the drift for later analysis of changes; 6. Automatically calibrate the scanners; 7. Allow easy control of beam position for making other measurements (e.g. to independently measure the beam power in order to find the system's power calibration factor); and 8. Permit the prediction of the size and shape of the cured plastic trace.

Accordingly, a need exists for an apparatus and method to calibrate and normalize a stereolithographic apparatus.

SUMMARY OF THE INVENTION

Briefly, and in general terms, the present invention provides a new and improved apparatus and method for normalizing and calibrating a stereolithographic apparatus.

In an apparatus for the production of parts by stereolithography it is useful to have an apparatus and a method for normalizing and calibrating the projection of the reaction means (in a preferred embodiment, a laser beam) upon a working medium (in a preferred embodiment, a designated surface of a photopolymer). Accurate positioning of the laser beam upon the working medium is preferably achieved by providing at least one sensor capable of being positioned at a predetermined location in the plane defined by the working medium. The sensor is sensitive to the presence of the laser beam. A memory stores information which includes the positioning information which causes the laser beam to be pointed accurately at the sensor. In a preferred embodiment, a memory look-up table or map is prepared containing specific positioning information for each of a number of specific locations on the surface of the working medium. A standard linear interpolation technique is utilized to determine positioning information useful to point the laser beam at points intermediate to those in the look-up table. Of course, other reaction means, besides a laser beam may be used to react the medium.

The present invention also provides a new method and apparatus for profiling a beam. The apparatus has means for measuring the intensity of a portion of the beam when the beam is incident on the measuring means and means for changing the relative perpendicular displacement of the measuring means from an optical path followed by the beam in order to measure the intensity of some or all portions of the beam along a surface substantially perpendicular to the optical path followed by the beam. The method for profiling a beam comprises the step of measuring the intensity of a cross-sectional portion of preselected size of the beam along a surface substantially perpendicular to the optical path followed by the beam and repeating the measuring step for other portions of the beam along the surface.

This apparatus and the method develops an intensity map of the beam along a surface substantially perpendicular to the optical path followed by the beam. The intensity map gives the intensities for each of the portions of preselected size of the cross-section of the beam. The intensity profile so gained can be used to determine and adjust the focus of the beam as well as to calculate the power of the beam (given a known power conversion factor). The profile of the beam may be used to predict the cure depth and width of plastic created on the working fluid. The beam profiling apparatus may be used to detect drift of the apparatus that scans the beam, by serving as a fixed reference point and determining the scanning apparatus coordinates of the center of the beam, which can be used to recalibrate the positioning "map" or table that directs the scanning apparatus in translating computer generated designs to actual dimensions on the surface of the fluid that solidifies to form the object.

The presently preferred version of the beam profiling system has a significant advantage of economy because it uses the computing system and light-beam positioning system which are already present in the stereolithographic apparatus. Although the present system refers to "laser beam" and "X-Y galvanometer scanning system" it is apparent that these advantages also apply to other possible systems with different energy sources or positioning means or combinations of these.

Accordingly, it is an object of this invention to provide an apparatus and method for accurately calibrating and normalizing a stereolithographic apparatus.

It is a further object of this invention to provide an improved and more accurate method and apparatus for profiling a beam.

The above and other objects and advantages of this invention will be apparent from the following more detailed description when taken in conjunction with the accompanying drawings of illustrative embodiments.

BRIEF DESCRIPTION OF THE DRAWINGS

FIG. 11A is a functional block diagram of the preferred embodiment of the method of generating an intensity profile of a beam according to the present invention;

FIG. 11B is a functional block diagram of a method of moving a beam in carrying out the method described in FIG. 11A;

FIG. 11C is a functional block diagram of a method of reading the intensity of a portion of a beam in carrying out the method described in FIG. 11A;

DESCRIPTION OF THE PREFERRED EMBODIMENT

The stereolithographic system with which the apparatus and method of the preferred embodiment of the present invention is used generates three-dimensional objects by creating a cross-sectional pattern of the object to be formed at a selected surface of a fluid medium, e.g., a UV curable liquid or the like, capable of altering its physical state in response to appropriate synergistic stimulation such as impinging radiation beams, or electron or other particle beam bombardment. Successive adjacent laminae, representing corresponding successive adjacent cross sections of the object, are automatically formed and integrated-together to provide a step-wise laminar or thin layer buildup o the object, whereby a three-dimensional object is formed and drawn from a substantially planar or sheet-like surface of the fluid medium during the forming process. The technique is generally described in the flow charts and diagrams of FIGS. 1–5.

Figure 1:
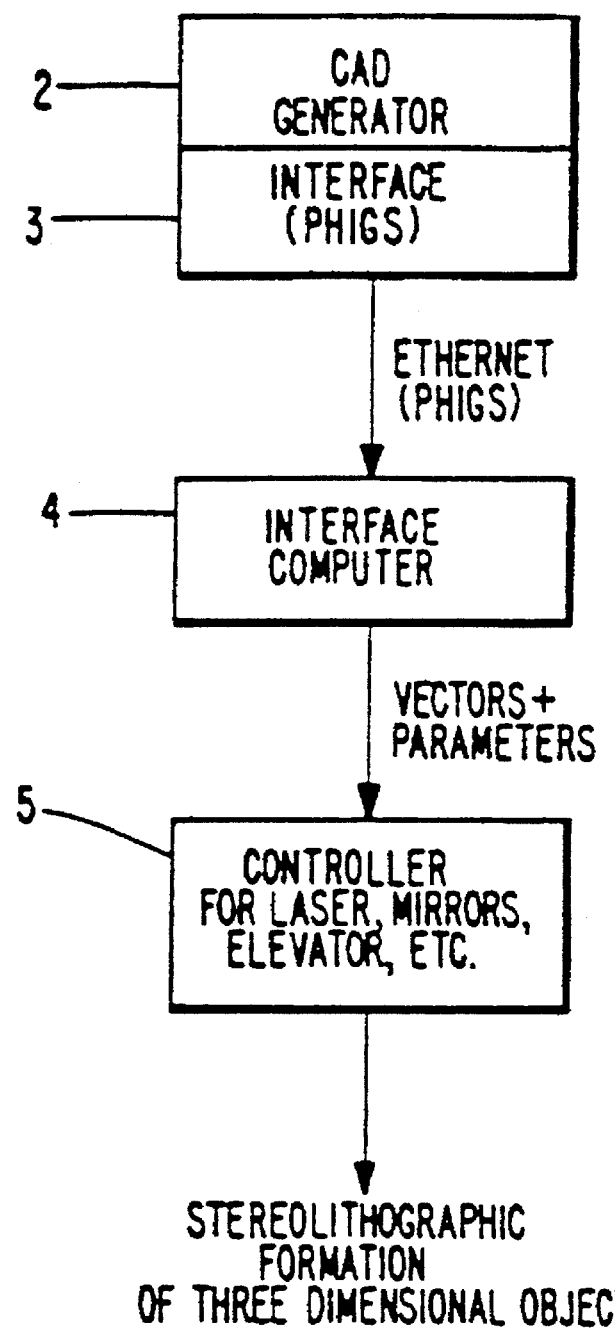
FIGS. 1, 2 and 3 are flow charts illustrating the basic concepts employed in practicing the method of stereolithography.
Figures 2, 3:
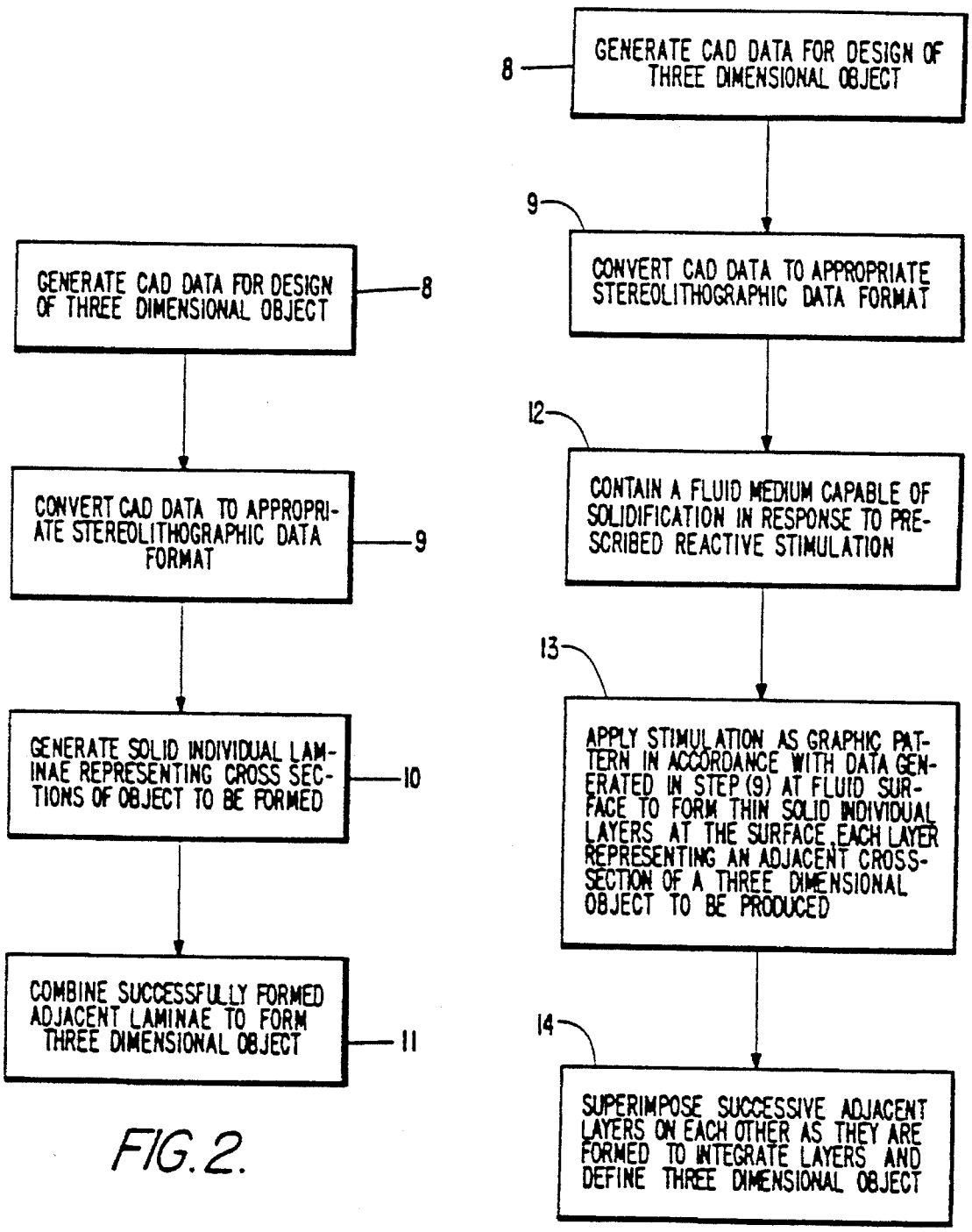
Figure 4:
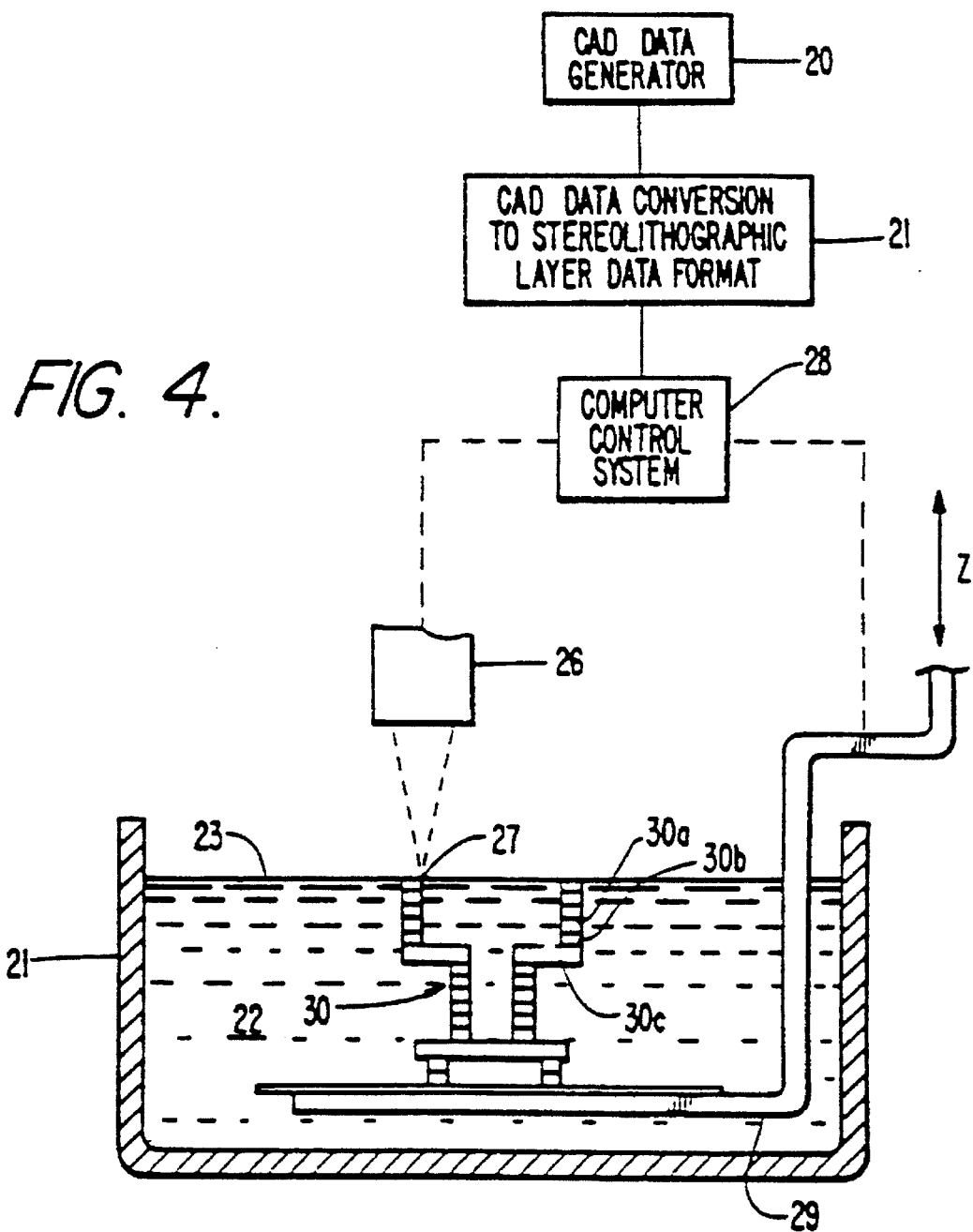
FIG. 4 is a combined block diagram, schematic and elevational sectional view of a stereolithography system.

A stereolithographic system is shown in elevational cross-section in FIG. 4. A container 21 is filled with a UV curable liquid 22 or the like, to provide a designated working surface 23. A programmable source of ultraviolet light 26 or the like produce a spot of ultraviolet light 27 in the plane of surface 23. The spot 27 is movable across the surface 23 by the motion of mirrors or other optical or mechanical elements (not shown in FIG. 4) used with the light source 26. The position of the spot 27 on surface 23 is controlled by a computer control system 28. The system may be under control of CAD data produced by a generator 20 in a CAD design system or the like and directed in PHIGS format or its equivalent to a computerized conversion system 21 where information defining the object is specially processed to reduce stress, curl and distortion, and increase resolution, strength and accuracy of reproduction.

A movable elevator platform 29 inside container 21 can be moved up and down selectively, the position of the platform being controlled by the system 28. As the device operates, it produces a three-dimensional object 30 by step-wise buildup of integrated laminae such as 30a, 30b, 30c.

The surface of the UV curable liquid 22 is maintained at a constant level in the container 21, and the spot of UV light 27, or other suitable form of reactive stimulation, of sufficient intensity to cure the liquid and convert it to a solid material is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 and new liquid 22 flows across the surface 23. A portion of this new liquid is, in turn, converted to solid material by the programmed UV light spot 27, and the new material adhesively connects to the material below it. This process is continued until the entire three-dimensional object 30 is formed. The object 30 is then removed from the container 21, and the apparatus is ready to produce another object. Another object can then be produced, or some new object can be made by changing the program in the computer 28.

The light source 26 of a stereolithography system according to a preferred embodiment of the invention is typically a helium-cadmium ultraviolet laser such as the Model 4240-N HeCd Multimode Laser, made by Liconix of Sunnyvale, Calif.

A commercial stereolithography system will have additional components and subsystems besides those previously shown in connection with the schematically depicted systems of FIGS. 1–5. For example, the commercial system would also have a frame and housing, and a control panel. It should have means to shield the operator from excess UV and visible light, and it may also have means to allow viewing of the object 30 while it is being formed. Commercial units will provide safety means for controlling ozone and noxious fumes, as well as conventional high voltage safety protection and interlocks. Some commercial units will also have means to effectively shield the sensitive electronics from electronic noise sources.

Figure 5:
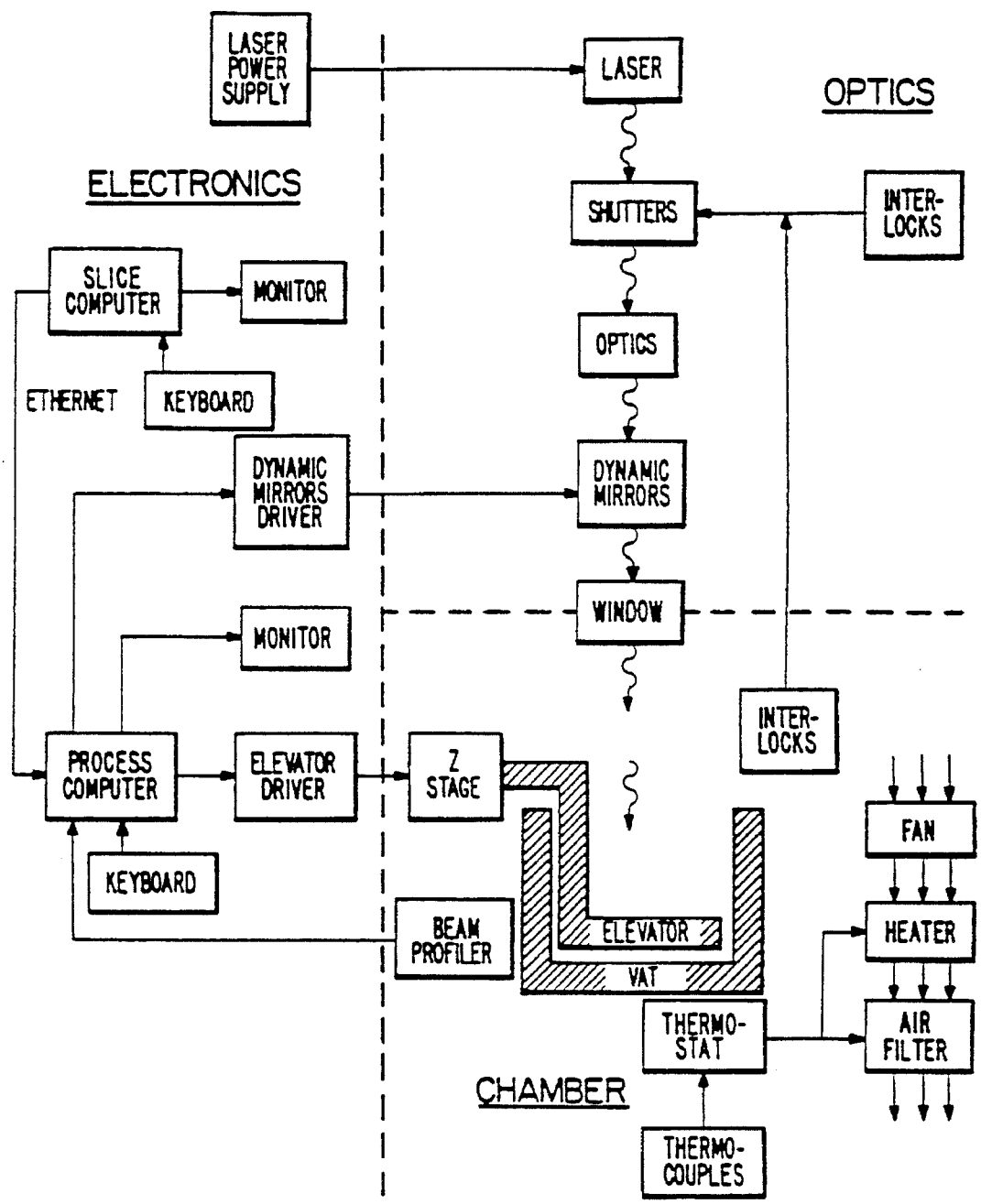
FIG. 5 is a block diagram of a stereolithography system.
Figure 6:
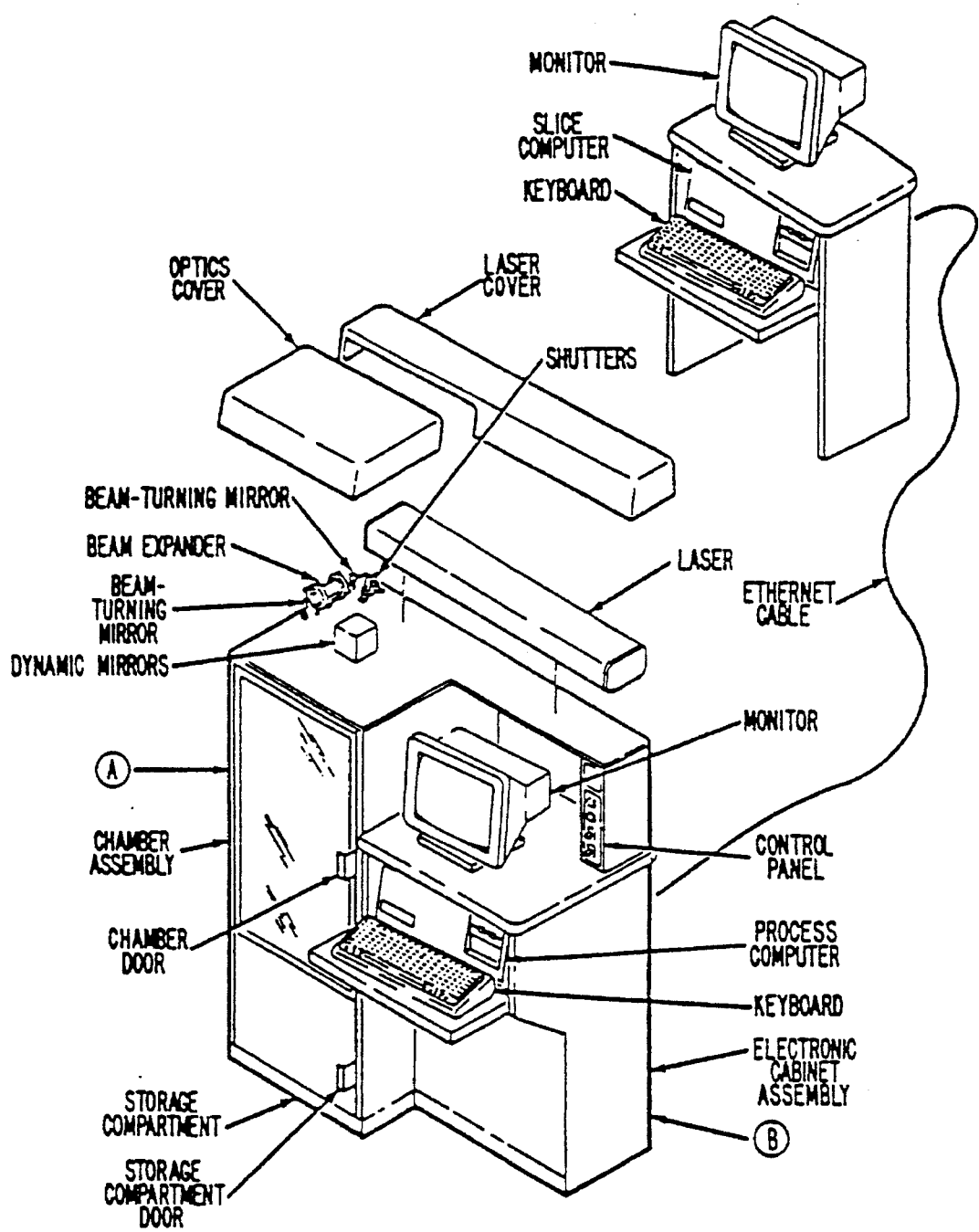
FIG. 6 is an exploded perspective view of a stereolithography system.
Figure 7A:
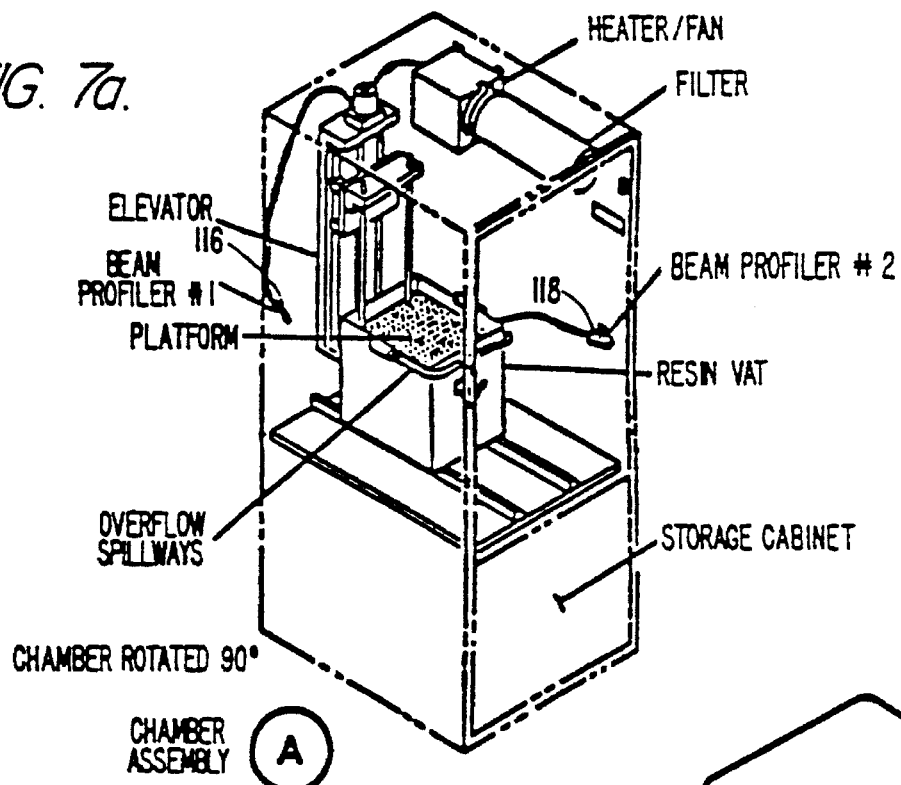
FIG. 7a is a perspective view of the major components located within the chamber assembly of a stereolithography system.
Figure 7B:
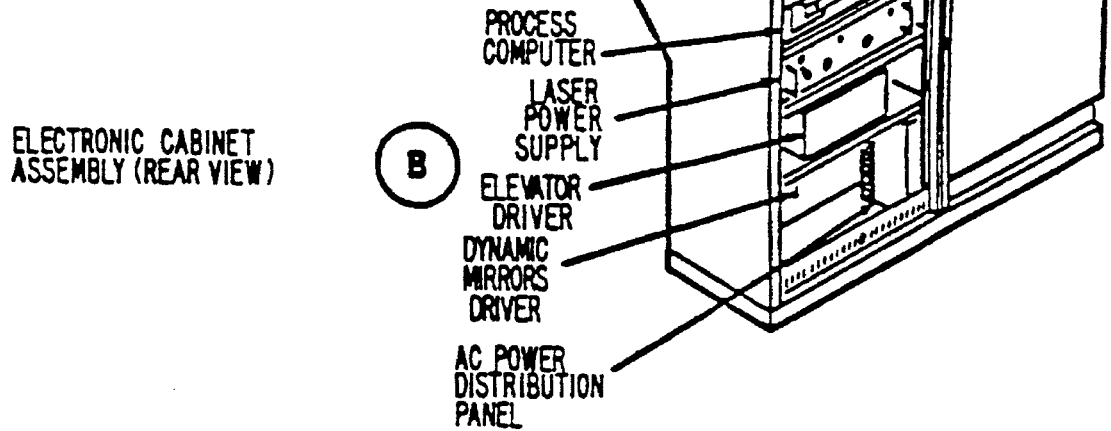
FIG. 7b is a perspective view of the primary electronic units of the stereolithography system.

The commercialized SLA is a self-contained system that interfaces directly with the user's CAD system. A commercialized SLA containing the preferred embodiment of the apparatus of the present invention, as shown in FIGS. 6 and 7, consists of four major component groups: the SLICE computer terminal, the electronic cabinet assembly, the optics assembly, and the chamber assembly. A block diagram of the commercialized SLA is shown in FIG. 5.

The electronic cabinet assembly includes the process computer, keyboard, monitor, power supplies, ac power distribution panel, and control panel. The computer assembly includes plug-in circuit boards for control of the terminal, high-speed scanner mirrors, and vertical (Z-stage) elevator. Power supplies for the laser, dynamic mirrors, and elevator motor are mounted in the lower portion of the cabinet.

The control panel includes a power on switch/indicator, a chamber light switch/indicator, a laser on indicator, and a shutter open indicator.

Operation and maintenance parameters, including fault diagnostics and laser performance information, are also typically displayed on the monitor. Operation is controlled by keyboard entries. work surfaces around the keyboard and computer are covered with Formica or the like for easy cleaning and long wear.

Figure 8:
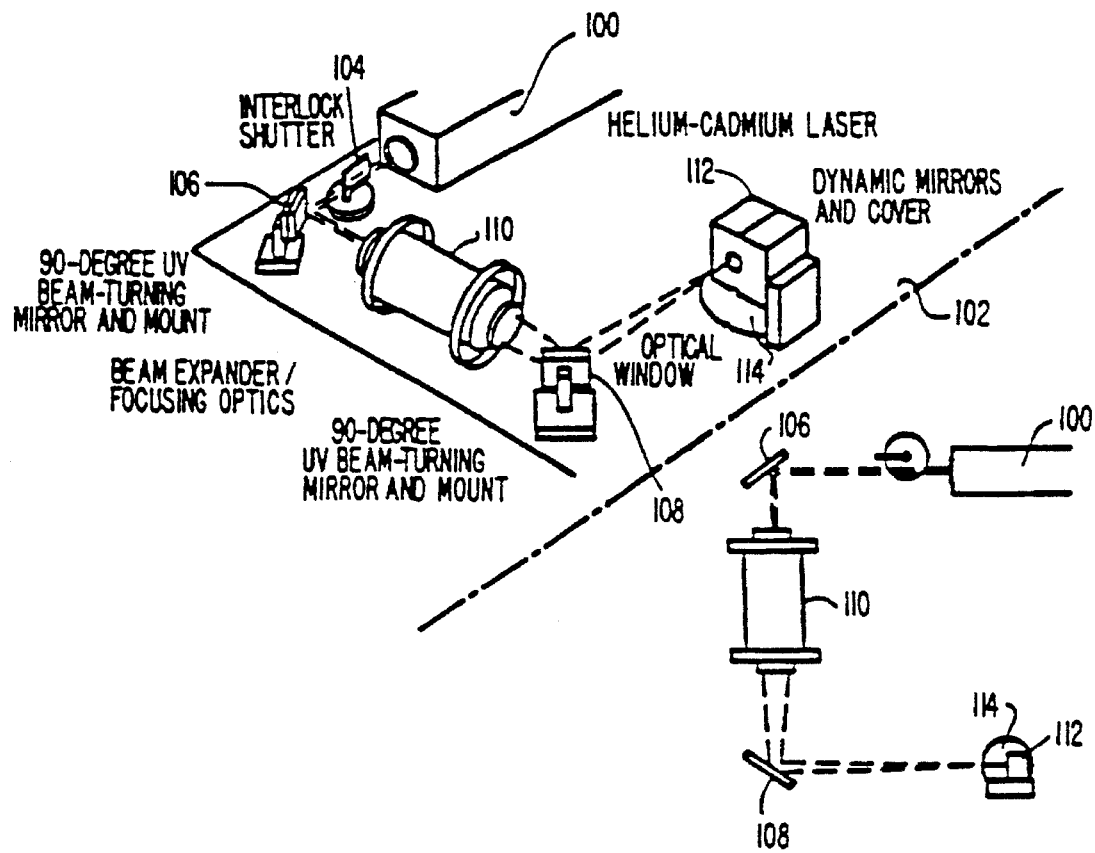
FIG. 8 is a perspective view of the laser and optical system in a stereolithography system which utilizes the preferred embodiment of the present invention.

Turning to FIG. 8, the helium cadmium (HeCd) laser 100 and optical components are mounted on top of the electronic cabinet and chamber assembly 102. The laser and optics plate may be accessed for service by removing separate covers. For safety reasons, a special tool is required to unlock the cover fasteners and interlock switches are activated when the covers are removed. The interlocks activate a solenoid-controlled shutter to block the laser beam when either cover is removed.

As shown in FIG. 8, the shutter assembly 104, two ninety degree beam-turning mirrors 106, 108, a beam expander 110, an X-Y scanning mirror assembly 112, and precision optical window 114 are mounted on the optics plate. The rotary solenoid-actuated shutters are installed at the laser output and rotate to block the beam when a safety interlock is opened. The ninety degree beam-turning mirrors 106, 108 reflect the laser beam to the next optical component. The beam expander 110 enlarges and focuses the laser beam on the liquid surface. The high speed scanning mirrors direct the laser beam to trace vectors on the resin surface. The 2-mirror, 2-axis galvanometer scan heads sold by General Scanning Inc. of Watertown, Mass. have been found to be satisfactory for this purpose and in a preferred embodiment their Model DX-2005 servo and Model XY-0507 galvanometer X-Y scanning heads are used. A quartz window 114 between the optics enclosure and reaction chamber allows the laser beam to pass into the reaction chamber, but otherwise isolates the two regions.

The chamber assembly contains an environmentally-controlled chamber, which houses a platform, resin vat, elevator, and beam profilers.

The chamber in which the object is formed is designed for operator safety and to ensure uniform operating conditions. The chamber may be heated to approximately 40° C. (104° F.) and the air is circulated and filtered. An overhead light illuminates the reaction vat and work surfaces. An interlock on the access door activates a shutter to block the laser beam when opened.

The resin vat is designed to minimize handling of the resin. It is typically installed in the chamber on guides which align it with the elevator and platform.

The object is formed on a platform attached to the vertical axis elevator, or Z-stage. The platform is immersed in the resin vat and it is adjusted incrementally downward while the object is being formed. To remove the formed part, it is raised to a position above the vat. The platform is then disconnected from the elevator and removed from the chamber for post processing. Handling trays are usually provided to catch dripping resin.

Two beam profiler sensors 116, 118 according to the preferred embodiment of the present invention are mounted at the sides of the resin vat and the focal point of the laser optical system is adjusted to match radial sensor positions (i.e., they are mounted at a radial distance from the galvanometer scanners equal to the distance from the galvanometers to a point 0.3 inches below the surface of the liquid). (See FIG. 7). The scanning mirror is periodically commanded to direct the laser beam onto the beam profiler sensors, which measure the beam intensity profile. The data may be displayed on the terminal, either as a profile with representation of intensity values or as a single number representing the overall (integrated) beam intensity. This information is used to determine whether the mirrors should be cleaned and aligned, whether the laser should be serviced, whether the scanner mirrors have drifted, and what parameter values will yield cured vectors of the desired thickness and width.

The beam profiler sensors 116, 118 are symmetrically placed relative to the center of the resin vat. (See FIG. 7). They should preferably have similar X and Y offsets as measured from the vat center (of opposite values) although this is not required; that is to say, they are on a diagonal of the stereolithographic apparatus. In FIG. 7, the beam profiler sensors 116, 118 are seen in the corners of the chamber assembly. The distance from the second scanning mirror in the scanning mirror assembly on the optical plate above the chamber assembly to each beam profiler sensor aperture is the focal length which equals the desired liquid to scanning mirror length plus a small increment. In the SLA-1 sold by 3D Systems, Inc. (which is shown in FIGS. 6 and 7), this liquid to scanning mirror length is approximately 27 inches and the small increment is an additional 0.3 inches, therefore the focal length is approximately 27.3". The distancing of the beam profiler sensors 116, 118 from the second mirror by the desired focal length has the effect of detecting the best average focus for the designated surface of the photopolymer in the SLA-1 resin vat. At the center of the resin vat, when the photopolymer is at the desired level, the focal length of the laser beam will be 0.3 inches below the surface of the photopolymer. The focus of the beam at the surface of the photopolymer in the center of the resin vat will not vary much. At the corner of the 12 inch resin vat of the SLA-1, the focal length will be approximately 1 inch above the surface of the photopolymer. The focal length will be at the surface of the photopolymer at a circle with a 4.2 inch radius about the center of the surface of the photopolymer. The placement of the beam profiler sensor at the focal length is intended to obtain an optimal beam profile considering that the surface of the photopolymer will mostly not be at the focal length of the laser.

Figure 9A:
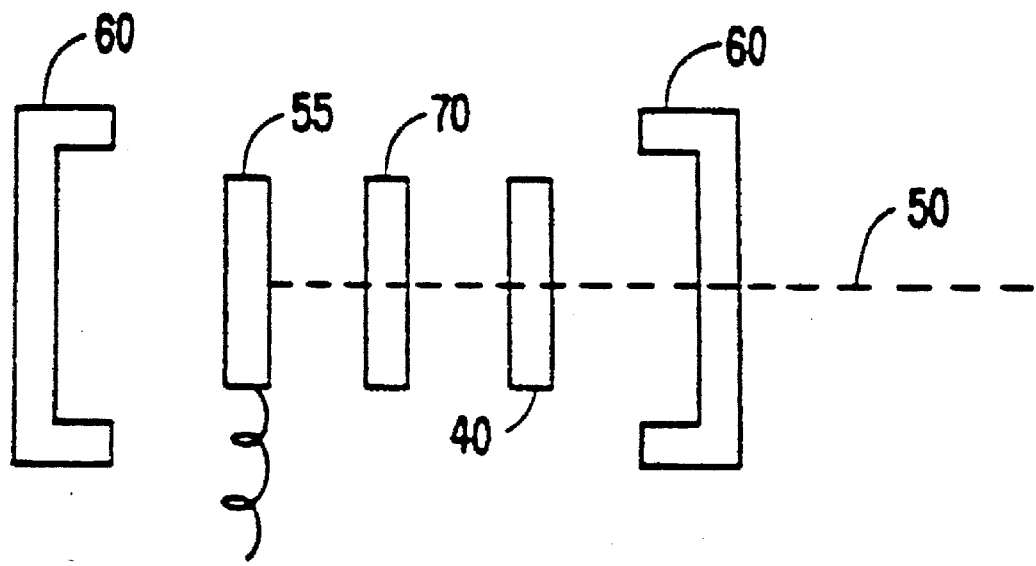
FIG. 9A is a cross-sectional schematic view of a beam profiler sensor of the preferred embodiment of the present invention.
Figure 9B:
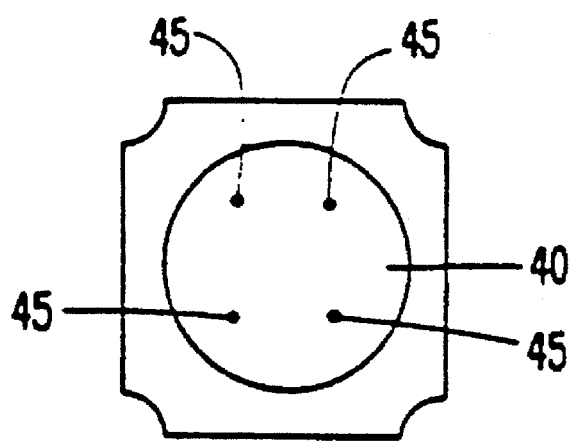
FIG. 9B is a top plan view of a pinhole plate for a beam profiler sensor of the preferred embodiment of the present invention.

FIG. 9A is a cross-sectional view of a beam profiler sensor 35 (the two different sensors are labeled as sensors 116 and 118 in FIG. 7) of a preferred embodiment of the apparatus of the present invention and FIG. 9B is a top plan view of a pinhole plate used in the beam profiler sensor. The beam profiler sensor has a thin stainless steel metal plate 40 having four etched pinholes 45 of varying size. In a preferred embodiment these holes have diameters 0.0005", 0.001", 0.002", and 0.004". The pinholes each permit a small fraction of the laser beam 50 incident upon the pinhole to fall on a photodetector 55 underneath the plate 40. The purpose for providing several pinholes is to permit profiling of beams having a wide range of incident power. One of the pinholes will be best suited for measuring the intensity profile of a beam of a given incident power. For the HeCd lasers used in the SLA-1, a pinhole of 2 mil (0.002 inch) diameter has been found to be satisfactory. The beam is scanned across a selected pinhole in an X Y array to build up a two dimensional profile of the beam intensity.

As may be seen in FIGS. 7 and especially 9A, the beam profiler sensor 35 has a two part housing 60. Light beam 50 enters from the right and moves toward the left in FIG. 9A. The beam profiler sensor is mounted in the corners of the chamber assembly compartment in such a way as to prevent the resin vat from hitting the beam profiler sensor when it is moved into and out of the compartment (see FIG. 7).

Turning to FIG. 9A the beam profiler sensor 35 comprises a split two part housing 60, pinhole plate 40, ultraviolet transmitting filter 70 that absorbs visible light and prevents spurious readings due to visible light. Filter 70 is a two millimeter thickness of Schott UG-11 filter glass which has been found to be acceptable for this purpose in a preferred embodiment. The characteristics of this filter provide reasonable transmission of light in the 300–370 nanometer wavelength region with considerably less transmittance at other wavelengths. A one-millimeter thickness of HOYA U-350 filter material would also be acceptable.

Underneath the filter 70 in the beam profiler housing is a photodiode sensor 55 which detects the ultraviolet light which passes through the filter 70 from the pinhole 45. An EEG Vactec VTS 3072 super blue enhanced photodiode has been found to be acceptable. The output from this photodiode is passed to a current to voltage amplifier (not shown). An OPO7 current to voltage amplifier whose implementation is well known to those skilled in the art has been found to be acceptable.

The pinhole plate 40 of the beam profiler sensor 35 is covered with a quartz plate (not shown). The quartz plate is cleanable and protects the beam profiler sensor from dust and photopolymer drips. The quartz plate should be coated to prevent internal reflections when the photosensor is not perpendicular to the beam, in order to prevent false shape measurements. Optionally a diffuser (not shown) can be used between the pinholes and the sensor to aid the filter to protect the optical components from damage by intense UV beams.

Figure 10:
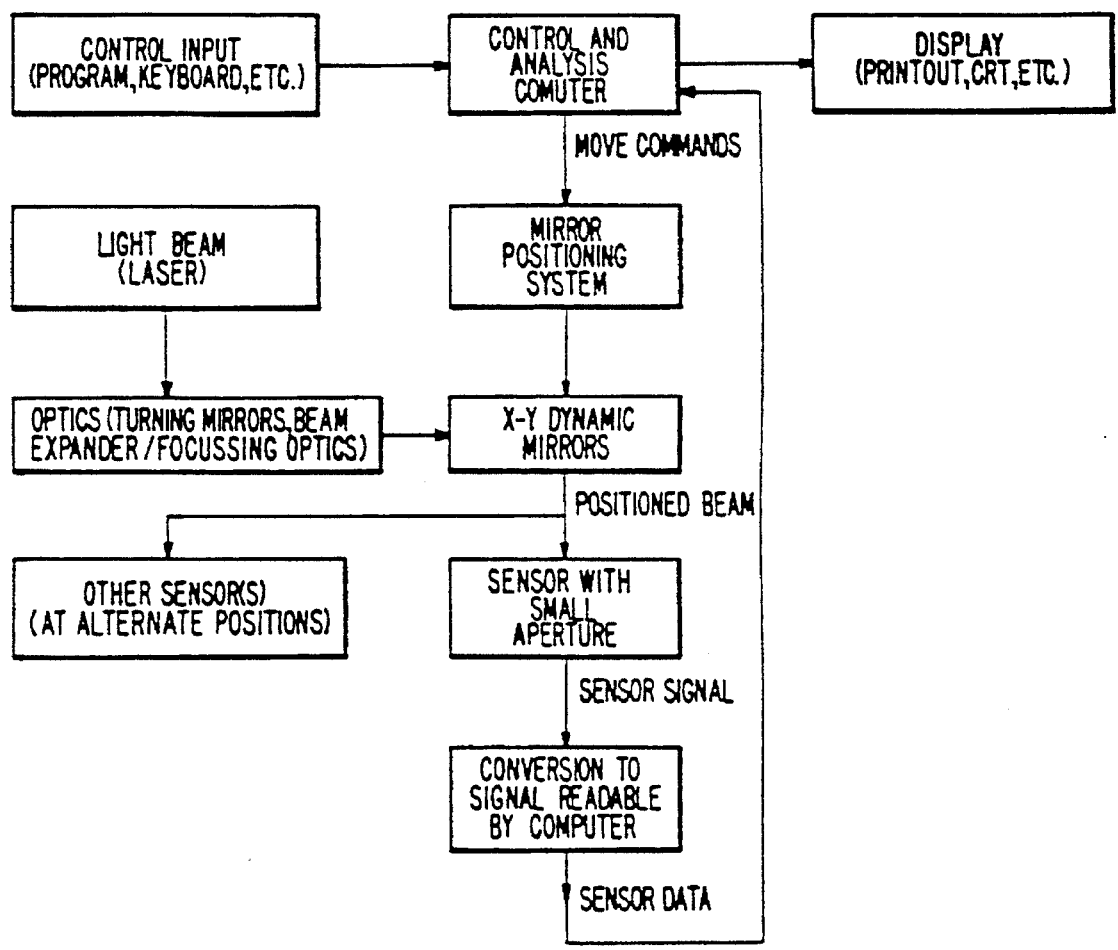
FIG. 10 is a block diagram showing the apparatus of a preferred embodiment of the present invention.

FIG. 10 is a block diagram showing the apparatus of the preferred embodiment of the present invention. Fundamental to the invention is a control and analysis computer. This computer receives inputs from a program, a keyboard or the like and may display results through a printer or terminal or the like. The control and analysis computer sends positioning commands to a mirror positioning system which controls the X Y scanner mirrors. The laser beam is focused by the optics shown in FIG. 8 to reach the X Y scanner mirrors and is directed by those mirrors to one of the beam profiler sensors. The use of two beam profiler sensors is recommended for the purpose of drift correction. The sensor signal from the beam profiler sensors is converted to a signal readable by the computer which is then sent back to the control and analysis computer to be manipulated as described hereafter.

In physical terms, the beam profile method according to the present invention causes the beam to be moved to each of the points of an array on the pinhole plate centered on the best known position of the pinhole. As a result, different sectors of the beam will fall on the pinhole and will be transmitted through the same to be detected by the photodiode and converted into a numerical signal that can be analyzed by the computer. A profile of the intensity of different sectors of the beam will be built up by the computer (see FIG. 13). This is the "intensity profile" of the beam.

FIG. 11A is a functional block diagram showing how a beam profile is developed according to the preferred embodiment of the invention. The best known location of a pinhole on the beam profiler sensor is called up from memory by the control and analysis computer and sent to the mirror positioning system to position the X Y scanner mirrors to direct the beam at this best known location. The control and analysis computer, through the beam positioning system, moves the beam to the first row in the first column of a square array centered on the best known location. The intensity of the portion of the beam entering the pinhole as detected by the beam profiler sensor is then read and is saved as well as the mirror position commands which are associated with that intensity. The beam is then moved in sequence from the first to the last array points on a particular row or column and the reading and saving intensity value steps are repeated. The beam is then moved in sequence from the first to the last array columns or rows and the moving and reading steps are then performed down each column or row. The result is that beam intensity readings are taken for each of the positions on the array (a "position" is known to the computer as a set of mirror positioning commands). A standard analysis, performed by the control and analysis computer of the array of intensity values is usually performed to generate a new best known location of the pinhole (for use in performing the first step of the scan profile the next time) regardless of the detailed function actually being analyzed (see FIG. 12). This calculated best known position can be found with great precision by this means, to an accuracy much finer than the size of the pinhole.

FIG. 11B is a functional block diagram of a method of moving a beam and carrying out the method described in connection with FIG. 11A. To move the beam, the first step is to send the beam positioning information to the servo-mechanism of the X Y scanner mirrors concerning the desired location. The servomechanism (which may be analog or digital) then sends a signal to the mirror drivers to position the X Y scanner mirrors to a new location. The servomechanism of the X Y scanner mirrors measures the actual position of the mirror drivers and compares the actual position with the intended position and adjusts the drive signals accordingly. The adjustments are continued within specification values of the intended location.

FIG. 11C is a functional block diagram of a method of reading the intensity of a portion of a beam and carrying out the method of the preferred embodiment of the present invention. The first step is to convert the total amount of light which passes through the pinhole into a signal which is proportional to that amount of light. In the preferred embodiment, this process is performed by the photodiode which measures the light coming through the pinhole and the filter. The current from the photodiode is sent to a current to voltage amplifier which generates a signal proportional to the amount of light received by the photodiode. The next step is to measure the signal, which is proportional to the amount of light received, after the signal is converted into a digital form for numerical analysis. Amplification of the signal to provide wide dynamic range of the measurement is important to obtain small but significant readings for the edge of the beam which would otherwise be lost.

Figure 12:
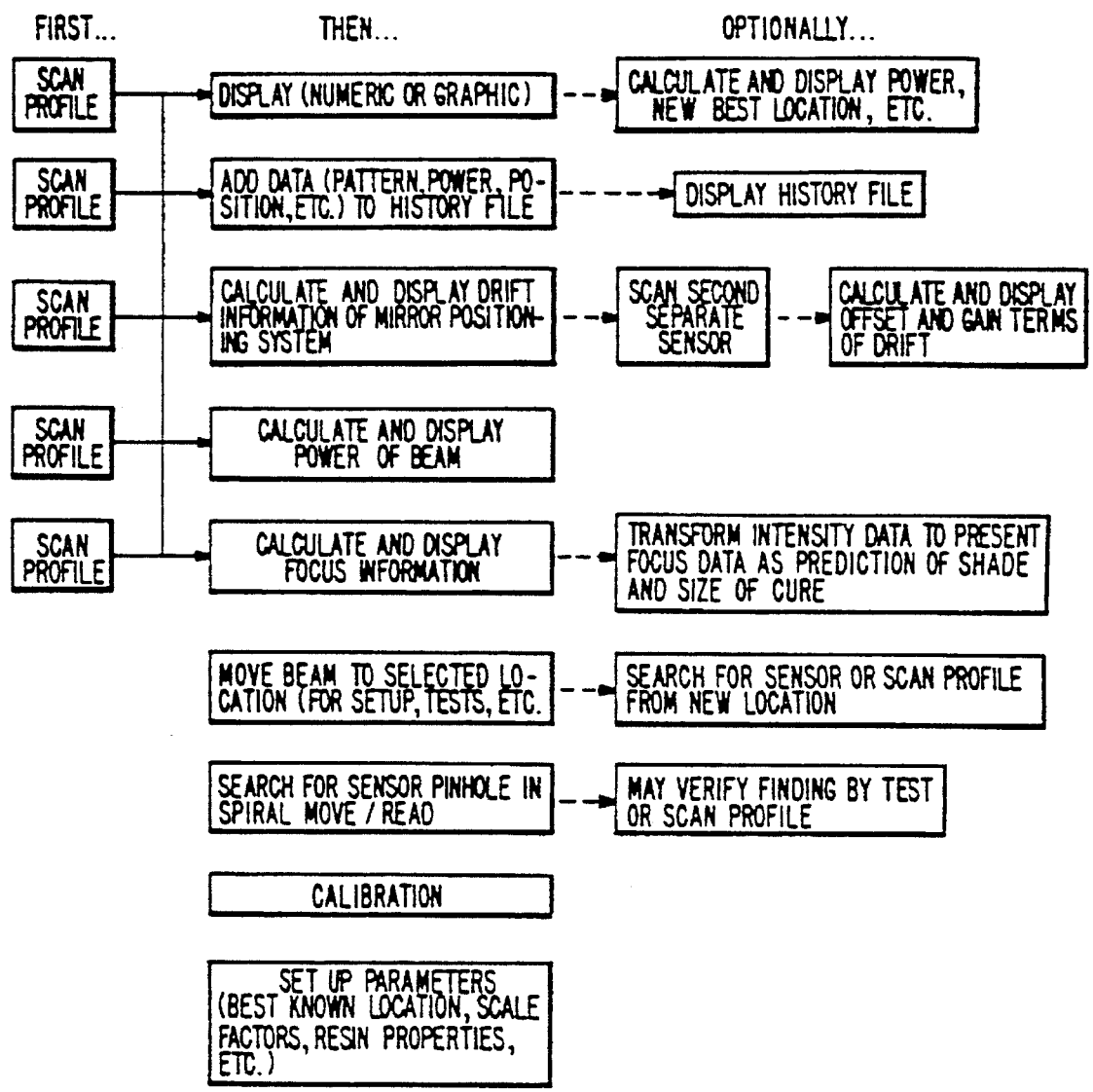
FIG. 12 is a functional block diagram showing process and analyses which may be coupled with the method described in FIG. 11A.

FIG. 12 is a functional block diagram showing the processes and analyses which may be coupled with the method described in FIG. 11A. As may be observed from that figure, a number of different processes and analyses may be selected from a menu, the first five of which are connected to the scan profile routine of FIG. 11A. The first step is to scan the intensity profile of the beam according to the method described in connection with FIG. 11A. The intensity profile may be displayed numerically or in the form of a graph. As an option, the power may be calculated from the intensity profile as well as a new best known location of the pinhole used. Another possible process is to add the data generated in connection with the beam intensity profile to a history file with an option of displaying the history file. A further possible process is to calculate and display drift information for the mirror positioning system which generally involves scanning a second separate sensor (in the case of the preferred embodiment, another beam profiler sensor) and then calculating and displaying the offset and gain terms of the drift. Another process is to calculate and display the power of the beam, which involves summing up the intensities of a profile and multiplying by a power conversion factor. The power conversion factor can be determined, for example, by utilizing the process with a beam of known power or by comparing calculated power to that of a calibrated sensor and determining required the gain factor. A further function is to calculate and display focus information, with a possible option of using a special transformation of the intensity data used to calculate focus information and the use of known resin properties to predict the shape and size of the cured traces of photopolymer. Another possible function is to move the beam to the desired location for set up (to make parts), tests and so forth with an option for searching for the sensor or scan profile from this new location. A useful function is to search for sensor pinholes in a spiral move-read format. This may be necessary if the best known location of the pinhole is not accurate, in case when the array is traced over the best known location the pinhole is not detected. A further step may be to verify findings (of pinhole location) by test or scan profile. A still further function is the use of the beam profilers in calibration, which involves the measurement of the drift while obtaining a calibration map for the surface corresponding to the surface of the photopolymer. A final function is to store in the machine the parameters of best known location, scale factors, resin properties, and so forth.

Figure 13:
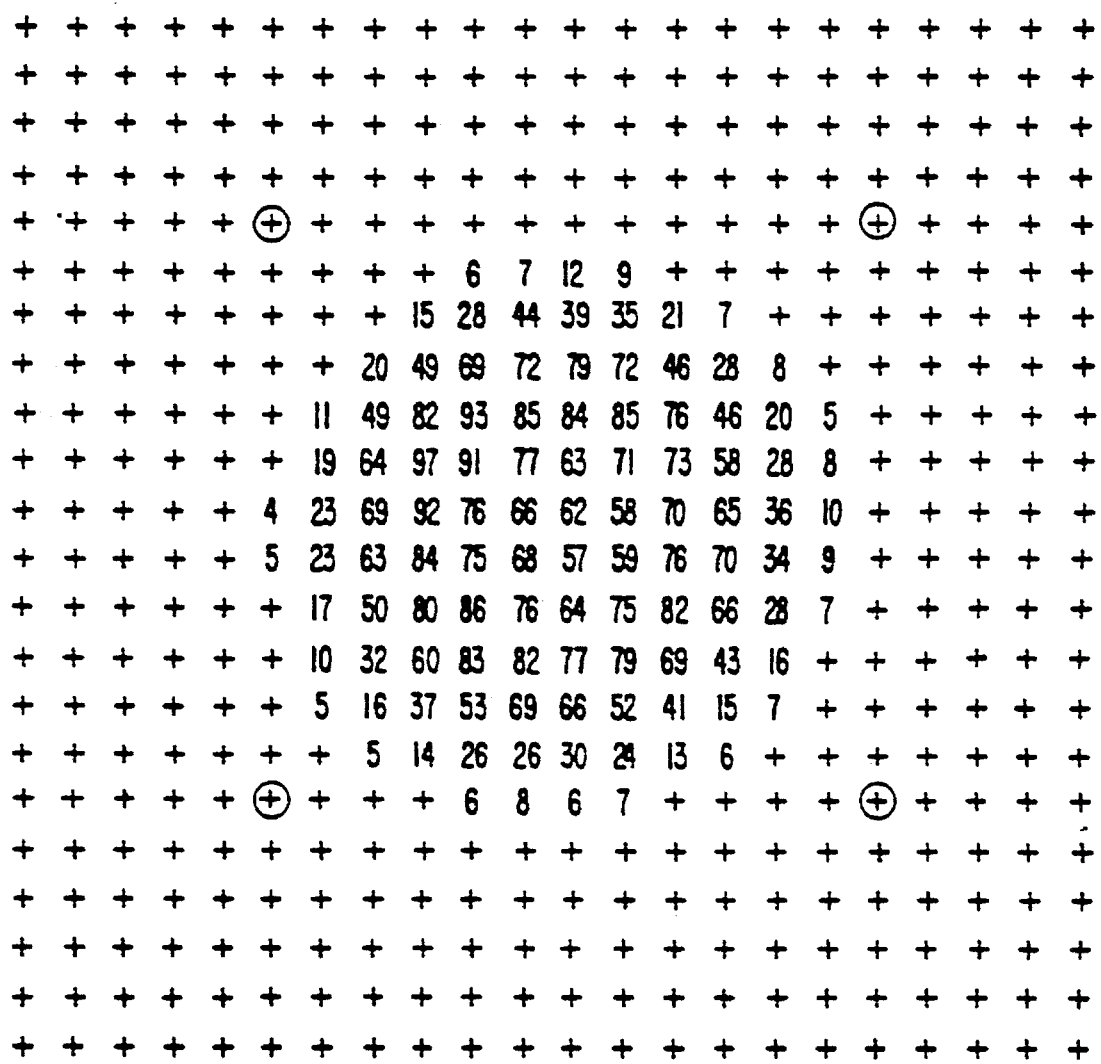
FIG. 13 is a chart showing mple intensity profile for a beam generated by a preferred embodiment of the invention.

FIG. 13 is a chart showing a sample intensity profile for a laser beam as generated by a preferred embodiment of the present invention. The numerical values correspond to the measured intensity of a beam from a preferred embodiment of the present invention. The numbers have been converted to integers for ease of reading the display.

The intensity profile generated by the present invention may be used to calculate the power of the beam and to predict the shape and dimension of a cured trace of photopolymer (the solidified photopolymer due to exposure to the beam of UV light), as the following discussion will demonstrate.

The intensity of the beam is measured by the beam profiling apparatus when the beam is directed at each point of an array on the pinhole plate, which is a surface generally perpendicular to the optical path taken by the beam. The X and Y directions on this surface correspond to the directions taken by the beam when one or the other of the scanning mirrors rotate.

The X and Y array coordinates are 1 to $i_{max}$ and 1 to $j_{max}$, respectively (typically $i_{max}$ and $j_{max}$ are each equal to 22).

The beam is typically stepped or moved from point to point in the array, the time for the movement being much less than the time the beam remains at a point. The distance between points is:

$$s\ (mm) = scanstep/scalefactor \quad [\text{Eq. 1}]$$

The scanstep is typically 4 "bits" and the scale factor is normally 140 bits/mm. The scanning mirrors can each take on 65535 (64K) different positions over a 40° optical beam rotation. This in turn means that 1 bit along the X or Y axis corresponds to a rotation of $6.104 \times 10^{-4}$" degrees. Since mirror to liquid distance is approximately 27" this angular rotation corresponds to a translation at the liquid surface of $2.875 \times 10^{-4}$ inches or equivalent 137 bits/mm or approximately 140 bits/mm.

The array area must cover the full beam (measurement of the entire beam is needed for power calibration as well as to produce the maximum information concerning the beam), and must have a number of points sufficient to resolve the desired beam profile. Typically, the spacing between points in this array is less than one tenth of the beam width. The pinhole diameter should be smaller than this resolution limit.

An "element" is the portion of a beam measured when the beam is directed at a point (m,n) of the array. Each element (m,n) has an intensity reading I(m,n). The letters m,n refer to positions or points in the X, Y directions in the array, respectively. FIG. 13 shows intensity readings in an array much as discussed here.

The beam power is measured independently and the power calibration factor k is derived from the following equation:

$$k * \sum_{m,n} I(m, n) = \text{Power (watts)} \qquad [\text{Eq. 2}]$$

The power calibration factor k only applies to the selected pinhole and measuring system and laser wavelength. The independent power measurement must be made on the beam after the beam has traversed the same number of optical surfaces in the beam path. These calculations also assume that the background light signals have been eliminated and amplifier scaling compensated for.

The power/unit area, or intensity, at element (m,n) is given by:

$$\text{Intensity (at element } m,n) = k * I(m,n)/s^2 \text{ (watts/mm}^2) \qquad [\text{Eq. 3}]$$

This is the instantaneous intensity experienced by a small area in the (m,n) element, regardless of whether the beam is stationary or moving.

When the beam is moving uniformly at the speed v (mm/sec) along the Y axis, then each element takes a time equal to s/v to pass, and the exposure, energy incident per unit area, from the element (m,n) is:

$$\text{Exposure from element } (m,n) = k * I(m,n)/s^2). \, (s/v) \text{ (Joules/mm}^2) \qquad [\text{Eq. 4}]$$

This is the energy absorbed per unit area from a particular element (m,n) of the beam.

The total exposure, beam energy incident on a unit area, as the entire beam passes an area equivalent in size to an element, as defined above, is:

$$\text{Exposure at } m = \left( k * \sum_n I(m, n)/s^2 \right) * (s/v) \text{ (Joules/mm}^2) \qquad [\text{Eq. 5}]$$

Physically speaking, this equation represents a situation in which the beam traverses in the Y direction over an area equivalent in size to an element of the beam as the term element is used above. The area is traversed by the elements of the beam corresponding to the X coordinate m, so the element-sized area at m is exposed to all elements (m,n) of the beam as n varies between 1 and $j_{max}$.

The calculations described above are based on discrete elements, but could obviously be generalized to use integrals. The movement is assumed along the Y axis for convenience. Other angles can be simply derived, and may be necessary if the beam is asymmetrical.

The speed v corresponds to parameters SS and SP as follows:

$$v = (SS/\text{ScaleFactor})/(SP/100,000) \text{ (mm/sec)} \qquad [\text{Eq. 6}]$$

Where:

SS=Step Size in bits/step;

ScaleFactor normally is 140 bits/mm;

SP/100,000=Step Period in seconds (SP units are units equal to 10 microsec); and 1E6=1,000,000 is a conversion factor between Joules/mm$^2$ and Joules/m$^2$ or microJoules/mm$^2$ Equations 5 and 6 are combined to calculate the total exposure (power incident per unit area in a given time, i.e. energy per unit area) at the sensor or at the liquid (photopolymer) surface represented by Z=0 at a small area at position m as the beam is moved in the Y direction:

Exposure at (m, z = 0):

$$E(m, z=0) = \sum_n I(m, n) * \frac{k * SP * \text{Scale Factor} * 1E6}{s * SS * 100,000} \qquad [\text{Eq. 7a}]$$

$$= \frac{\sum_n I(m, n) * SP * \text{Scale Factor} * \text{power} * 10}{\sum_{m,n} I(m, n) * SS * s} \text{ uJ/mm}^2 \qquad [\text{Eq. 7b}]$$

Finally, the absorption of the beam as it penetrates into the liquid may now be compensated for in accordance with Beer's law:

$$E(m,z) = E(m,0) * \exp(-z/\text{lambda}) \qquad [\text{Eq. 8}]$$

Where:

lambda is the penetration depth (mm);

E(m,0) is the summed exposure at the surface; and

E(m,z) is the exposure at depth z below the surface (mm).

Attenuation is assumed to have no nonlinearities or time-dependence in absorption, being represented simply by I(z)=I(z=0)*exp(-z/lambda). It is clear that appropriate modifications can be made to the foregoing calculations to allow for deviations from the above simple absorptive behavior.

The photopolymer has been shown experimentally to cure to a gel if the exposure is greater than a critical value Ec, so for any given system the shape of a trace of cured plastic can be predicted by calculating the locus of points having exposure Ec. Ec can be accurately and separately measured for each photopolymer. The "gel point" gives only the "cured" versus "not cured" boundary, and disregards the gradient in exposure (related to penetration depth) at resin depths other than the Ec boundary depth. Part strength seems to relate to the higher exposure, and so absorption characteristics should be chosen to give the best (highest) cure gradient. The gradient or penetration depth also limits the best available resolution in the Z direction, because some variation in exposure (crossing lines, etc.) is unavoidable and this results in cure depth changes with this variation in exposure.

For any X location (m) the cured depth $z_c m$ is found from:

$$z_c(m) = \text{lambda} * \ln(E(m,z=0)/Ec) \qquad [\text{Eq. 9}]$$

Figure 14:
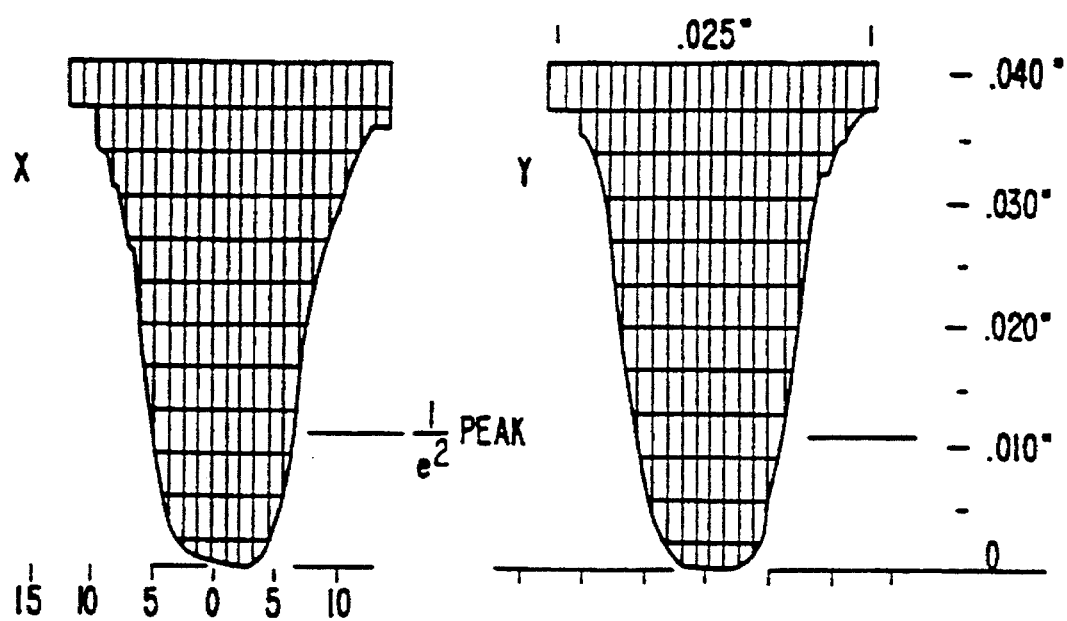
FIG. 14 shows predicted cure depth profiles along two axes generated from beam profile information from a preferred embodiment of the present invention.
Figure 15:
FIG. 15 depicts a cross-section of a cured photopolymer trace caused by exposure to a beam.

A beam profile measured with sufficient reliability and precision can be used to predict cure depths dependent only on chemical properties of a resin. FIG. 14 shows two examples of such predictions, along the X and Y axis respectively. The profile function (m,z) also permits prediction of the trace width as a function of depth (and with appropriate modifications, "beam width" and "minimum surface angle") automatically. Making and measuring "banjo tops," i.e., traces cured by the beam to directly determine the shape and dimensions of the cured photopolymer, will only be needed as an internal check of the system. FIG. 15 shows a cross-section of a test trace from a banjo top. FIG. 15 should be compared with FIG. 14.

To display the predicted trace profile, a scaled diagram of cure depth versus position is plotted across the beam. The scale factor for distance across the beam is easy, where one simply selects one column (or row, etc.) of the scan, with dimension S, to correspond to a pixel or graphics display block. The depth scale is then lambda/s pixels (or blocks) for each increase in exposure by a factor of e. The only arbitrary feature is the zero of depth, related to the characteristic exposure Ec of Eq. 9, or equivalent factors from Eg. 7. The useful depth to be displayed is determined by the dynamic range of the intensity measuring system, and truncation at $I(m,n) \geq$ any appropriate value close to the noise level.

Software code listings of the software of a preferred embodiment of the present invention are contained in the technical appendices to the parent application, Ser. No. 182,830 filed Apr. 18, 1988 now U.S. Pat. No. 5,059,359, which is herein incorporated by reference as set forth above.

DRIFT CORRECTION

Drift correction is a procedure which compensates for drift of, inter alia, the mirror positioning system by periodically checking on the apparent position of one or more beam profile sensors (herein referred to as "sensor means"). Measurements of changes in the apparent position of a single sensor allow for compensation for drift of the "zero setting" of the mirror system, two separate sensors allow additionally for correcting for otherwise uncompensated gain in the system and/or otherwise uncompensated changes in size of parts of the SLA due to thermal and other effects. Other errors can be corrected by utilization of even more sensors although in a preferred embodiment of the present invention two beam profile sensors are deemed sufficient.

In a preferred embodiment of the present invention, a calibration operation is periodically performed. In the calibration procedure of a preferred embodiment, a plate having a number of holes and sensors is utilized to generate in system memory a table of mirror position settings which correspond to fixed predetermined locations on the plate.

During the time a calibration is being run, the system periodically checks on the apparent locations of two sensors. These measurements are used to correct the calibration measurements for this amount of drift, so that the values are all normalized to a "standard" pair of apparent positions of the two sensors. When later building a part, the same two sensors are again scanned periodically, and the apparent positions can be used to correct for changes in the zero and gain of the mirror system relative to the time at which the calibration was made. This procedure has been found to remove 90% of the error caused by drift of the mirrors.

In the drift compensation method and apparatus of a preferred embodiment of the present invention two beam profile sensors capable of detecting when the laser beam is directed toward them by the mirror positioning system are mounted fixedly in predetermined locations fixed with respect to a designated surface of the solidifiable working medium upon which the scanning reaction means impinges to solidify said medium.

Periodically the laser beam is directed toward the sensors and sensor location output means provide a readout of the apparent location of the sensors. The current apparent location of the sensors are compared with a past apparent location of the sensors which is stored in memory and a difference indicates the need for a drift correction.

For example, when a single sensor No. 1 is in use, if this sensor No. 1 had a past apparent position of X=20, Y=20 and a current apparent position of X=22, Y=22 then a drift of +2X and +2Y has occurred and the mirror positioning system can apply an appropriate correction factor in order to point the beam in the desired location. As another example when in addition to this first sensor, a second sensor is used, then the second sensor might be read at calibration to be X=64000, Y=64000 and have a current apparent position of X=64004, Y=64003. Were this the case, in addition to a linear shift of +2X, +2Y across the entire system (the two sensors conveniently being located on a diagonal) there would also be a gain or stretching of +2X, +1Y of the apparent distance between sensors No. 1 and No. 2 and we expect and correct for proportionately different stretching for different locations relative to the sensor No. 1. In compensating, linear interpolation could be used to help the mirror positioning system compensate for the gain term in the drift error.

A description of the drift correction procedure and apparatus is contained in United States patent application S.N. Ser. No. 268,907, filed Apr. 18, 1988, now U.S. Pat. No. 5,059,359, incorporated fully herein by reference.

CALIBRATION AND NORMALIZATION

As pointed out above, it is desirable in a stereolithographic apparatus to provide apparatus and method for calibrating the pointing of a reaction means on a working medium for improved precision and accuracy.

Calibration procedures of a preferred embodiment of the present invention allow the creation of a "map" from a design in CAD space to drawing instructions on the real SLA. In any automated building system there will be several different sources of error needing to be corrected by calibration procedures. The present system has a pair of scanning mirrors close together, and, if left uncorrected a simple mapping of CAD dimensions to the angles of the mirrors will result in pincushion distortion. This is because the system is building on a flat surface where further from the point on the surface nearest to the mirrors, equal increments of angle will project to progressively greater distances on the surface. This happens to be the dominant distortion in the present system, and is predictable from geometry so that its correction could be calculated. However there are numerous other errors and distortions which need to be compensated, and many of them are not readily predictable.

The calibration and normalization system of the present invention is useable in a broad range of applications and systems and automatically generates a "look-up table" to enable the conversion of CAD locations into instructions which are to be sent to the scanning system so that the intended pattern will be drawn on the working surface. The term "Normalization" may be used to indicate that more than one dimension at a time is being corrected, while "Calibration" could have connotations of applying a single scale factor to a system. In a preferred embodiment, the apparatus has a single position (beam profile) sensor which is moved automatically to an array of points on the working surface, and then a record is made of the corresponding mirror instructions needed to reach each of these points. In another preferred embodiment a square array of sensor pinholes is utilized so that no movement of the sensor was required. In yet another preferred embodiment, a linear array of pinhole sensors needing to be moved along only one axis is utilized.

Figure 16A:
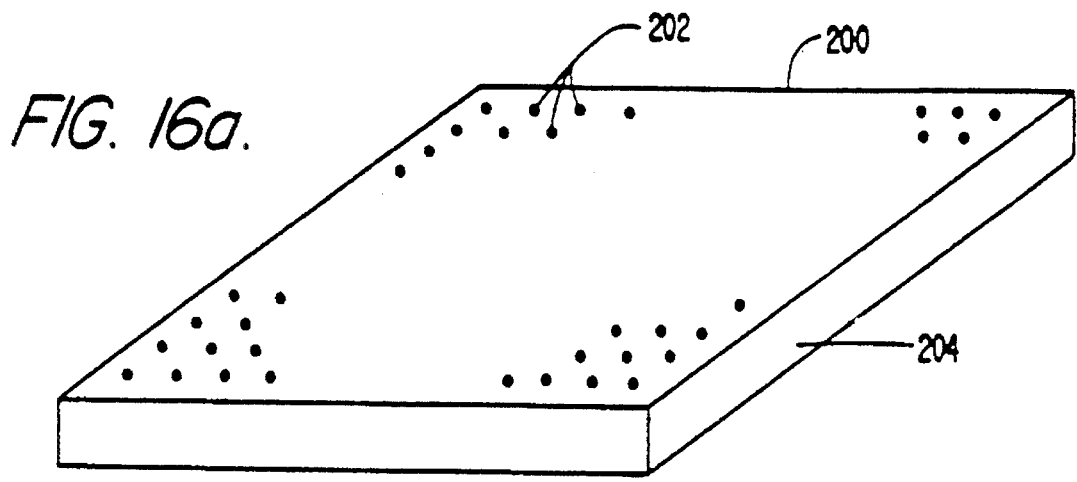
FIG. 16A shows a perspective view of a calibration plate.
Figure 16B:
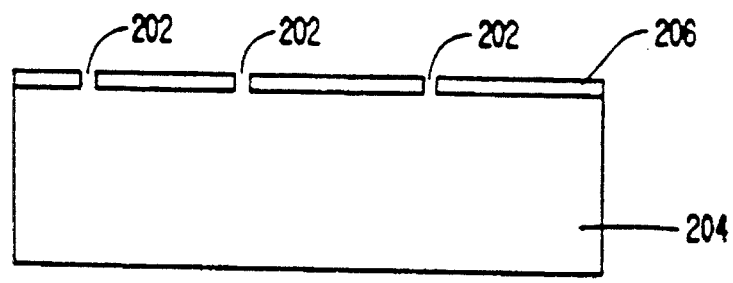
FIG. 16B shows a cross-sectional elevation of a calibration plate.

Turning to FIG. 16A and 16B the square calibration plate 200 of a preferred embodiment of the present invention is depicted. An ultraviolet-opaque metallic coating 206 is provided by evaporation on a substrate 204 made preferably of quartz or pyrex of ⅛-inch to ¼-inch thickness. In a preferred embodiment an array of 49 by 49 boles 202 are etched in the UV-opaque metallic coating 206 on ¼-inch centers. Each etched hole has a diameter of 0.004"±0.0005" although it is only important that the hole be of smaller diameter than the diameter of the projected beam at the plate for best resolution. Sensors (not shown) are mounted below the plate and when the calibration plate is in use, it is arranged to be in the precise location of the surface of the working medium.

In a presently preferred embodiment of the invention, an array of 5×5 or 25 photodiodes 208 sensitive to UV light are utilized in conjunction with the calibration plate. Because UV light can only enter the plate assembly through one of the pinholes and because the plate material tends to diffuse light that enters, light entering a pinhole will travel horizontally beyond the exact location of the pinhole so that in a preferred embodiment 25 sensors such as the sensors herein previously described are adequate to cover the entire 49×49 array of pinholes.

Typically a calibration procedure will be performed prior to shipping an SLA to a customer and after any physical trauma to the mirror control system which would tend to uncalibrate the SLA.

In operation the calibration procedure uses the same beam profiler methodology to obtain a "best location" of a pinhole from the centroid of the scan data.

A new "best location" is obtained for each pinhole in the case of the plate, each pinhole-column location in the case of the linear array, and each predetermined location in the case of a sensor positioned at certain predetermined locations. It is not always necessary to scan each pinhole in order to obtain a working and practically useable look-up table. In a preferred embodiment of the present invention only about 40×40 pinholes are located and mapped. In situations where there are smaller geometric distortions, or less precision desired, or the other sources of distortion are suitable for correction with more reliance on interpolation, fewer pinholes could be mapped. Linear interpolation relative to the X and Y locations is used to determine mirror positioning for points intermediate to the "best locations" stored in the look-up table in memory. The appropriate number of pinholes will be determined from these considerations, and from the time needed to make the calibration, and from the system memory available for storing the look-up table.

Optionally and preferably the drift correction apparatus and method previously described are used in conjunction with calibration to obtain more precise and more accurate results. Similarly, during part building the same drift correction method and apparatus are used to improve precision and accuracy.

Briefly the method of a preferred embodiment of the present invention is set forth below:

STEP 1: User inserts calibration plate into SLA building chamber with its sensor pinholes positioned where the liquid surface normally stays; user specifies the delay times between reading sensors 1 and 2 (Fixed Beam Profile Sensors 116, 118) and the Calibration Plate (deemed "Sensor 3") locations.

STEP 2: Sensors 1 and 2 are located again as they are located when the first scan profile occurs to finalize and store their apparent coordinates in terms of mirror position information.

STEP 3: Center the calibration plate by determining if the center sensor 3 leading coordinates are within acceptable tolerances. The center plate coordinates should correspond to the mirror positioning center coordinates. This configuration allows maximum equal mirror movements in all directions.

STEP 4: The gain of the calibration plate (Sensor 3) is set by reading the center hole of the plate (which is found with the find sensor algorithm defined in Beam Profile FIG. 1). The actual beam intensity is derived by reading Sensor 3 with and without the beam in the center hole. This subtracts the background noise Sensor 3 receives. The gain control is adjusted by the user until the sensor sensitivity is optimized.

STEP 5: The borders of the calibration plate are established by stepping the beam from plate holes to the borders of the plate (1=West left, 2= North, 3=South down, an 4—East right).

A) Move in direction 1, locating holes along the way by moving a predetermined (bits/hole separation) value. Bits refer to mirror coordinate change values.

B) When the known number of holes before the border are read, one more "bits/hole separation" movement is executed.

C) If a read finds a hole there, either the gain is set incorrectly because a false hole has been read, or the hole to the right of the center hole was where the search started.

Return to Step 3.

D) If no hole is detected, the left and right borders are now established.

E) The beam returns to the center hole and begins a search for the back border in a similar fashion to A–D.

F) Once all borders are established through movements 1 and 2, the values of the hole locations for movements 1, 2, 3, and 4 are manner used to build a "rough map of hole separations" across the plate in mirror bits.

Movement 4 leaves the beam at plate hole (1,1).

STEP 6: Quick search for all plate hole locations. If any hole cannot be located the beam is left at its most probable location, as determined by the "rough map of hole separations", and prompts the user to examine for dust around the hole location. After the wait the find is resumed until the hole is found or the user aborts. The gain may be reset in this process if the user desires. If the gain is changed the user restarts the quick search at hole (1,1).

STEP 7: After the quick search locates all the plate holes a final search is performed with the requested delays from Step 1. Also, on both quick and final searches the locations of sensors 1 and 2 are found to determine GAIN and OFFSET corrections to be made at the intervals (end of each row) of mirror bit movements to the same locations. These correction factors are applied proportionately to correct each of the calibration locations in a normalized to a single set of reference locations of the fixed sensors 1 and 2.

STEP 8: After the final search stores all the gain, offset, intensity, and locations data the procedure ends.

It will be apparent from the foregoing that, while particular forms of the invention have been illustrated and described, various modifications can be made without departing from the spirit and scope of the invention. Accordingly, it is not intended that the invention be limited, except as by the appended claims.

We claim:

1. A method for calibrating and normalizing an apparatus for the production of a three-dimensional object from a medium capable of selective physical transformation when exposed to a reaction means operating in a prescribed manner upon a designated working surface of the medium defining a working region of the apparatus to transform successive laminae forming the object, the improvement comprising the steps of:

defining a number of known locations near the working surface with known spatial relationships between each location;

directing the reaction means using desired positioner information to a plurality of locations near said working surface;

recording the positioner information used to direct the reaction means;

sensing the plurality of locations to which the reaction means is directed;

using the sensed position, the known locations, the known spatial relationships and the recorded positioner information to calibrate and normalize the apparatus.

2. The method of claim 1 wherein the step of using comprises:

determining that the sensed positions are substantially coincident with the known locations.

3. The method of claim 2 additionally comprising:

determining a centroid of the intensity of the reaction means;

correlating the positioner information with the centroid of the intensity distribution to determine best positioner information;

using the best positioner information to calibrate and normalize the apparatus.

4. The method of claim 2 wherein the plurality of known locations are located at the working surface.

5. The method of claim 2 wherein a substantial number of the plurality of known locations are temporarily located within the working region of the apparatus.

6. The method of claim 2 wherein the step of using comprises:

using said recorded positioner information, said known spatial relationships, and desired cross-sectional spatial relationships of the three-dimensional object to transform data representing the desired cross-sectional spatial relationships of the three-dimensional object to positioning information necessary to accurately position the reaction means on the working surface.

7. The method of claim 6 wherein the step of directing utilizes rotational scanning mirrors.

8. The method of claim 7 wherein the medium is a photopolymer.

9. The method of claim 8 wherein the reaction means is a laser beam.

10. The method of claim 9 wherein the laser beam is a UV laser beam.

11. In a machine for the production of a three-dimensional object from a medium capable of selected physical transformation when exposed to a reaction means operating in a prescribed manner upon a designated working surface of the medium defining a working region of the machine to form successive laminae forming the object, the improvement of an apparatus for calibrating and normalizing the machine prior to operation of the machine to make the three-dimensional object, comprising:

means for defining a number of known locations near the working surface with desired spatial relationships between each location;

means for directing the reaction means using desired positioner information to a plurality of locations near said working surface;

means for storing the positioner information used to direct the reaction means;

means for sensing the plurality of locations to which the reaction means is directed;

means for using the sensed position, the known locations, the desired spatial relationships and the recorded positioner information to calibrate and normalize the apparatus.

12. The apparatus of claim 11 wherein the means for using comprises:

means for determining that the sensed positions are substantially coincident with the known locations.

13. The apparatus of claim 12 additionally comprising:

means for determining a centroid of the intensity of the reaction means;

correlating the positioner information with the centroid of the intensity distribution to determine best positioner information;

using the best positioner information to calibrate and normalize the apparatus.

14. The apparatus of claim 12 wherein the plurality of known locations are located at the working surface.

15. The apparatus of claim 12 wherein a substantial number of the plurality of known locations are temporarily located within the working region of the apparatus.

16. The apparatus of claim 12 wherein the means for using comprises:

means for using said recorded positioner information, said known spatial relationships, and desired cross-sectional spatial relationships of the three-dimensional object to transform data representing the desired cross-sectional spatial relationships of the three-dimensional object to positioning information necessary to accurately position the reaction means on the working surface.

17. The apparatus of claim 16 wherein means for directing comprises rotational scanning mirrors.

18. The apparatus of claim 17 wherein the medium is a photopolymer.

19. The apparatus of claim 18 wherein the reaction means is a laser beam.

20. The apparatus of claim 19 wherein the laser beam is a UV laser beam.

21. A method for calibrating and normalizing an apparatus for the production of a three-dimensional object from a medium capable of selective physical transformation when exposed to a reaction means operating in a prescribed manner upon a designated working surface of the medium defining a working region of the machine to transform successive laminae forming the object, the improvement comprising the steps of:

defining a number of known locations near the working surface with known spatial relationships between each location;

directing the reaction means to a plurality of desired locations near said working surface using desired positioner information;

sensing the locations where the reaction means is directed;

causing said plurality of known locations and said desired locations to be substantially coincident;

receiving data representing a cross-section of the three-dimensional object to be formed wherein the data represents desired spatial relationships between a plurality of points to be solidified;

using said known spatial relationships and said desired positioner information to map the data which represents desired spatial relationships between the plurality of points to be exposed to derive necessary positioner information to accurately position the reaction means onto the working surface.

22. In a machine for the production of a three-dimensional object from a medium capable of selected physical transformation when exposed to a reaction means operating in a prescribed manner upon a designated working surface of the medium defining a working region of the machine to form successive laminae forming the object, the improvement of an apparatus for calibrating and normalizing the machine prior to operation of the machine to make the three-dimensional object, comprising:

means for defining a number of known locations near the working surface with known spatial relationships between each location;

means for directing the reaction means to a plurality of desired locations near said working surface using desired positioner information;

means for sensing the locations where the reaction means is directed;

means for causing said plurality of known locations and said desired locations to be substantially coincident;

means for receiving data representing a cross-section of the three-dimensional object to be formed wherein the data represents desired spatial relationships between a plurality of points to be solidified;

means for using said known spatial relationships and said desired positioner information to map the data which represents desired spatial relationships between the plurality of points to be exposed to derive necessary positioner information to accurately position the reaction means onto the working surface.

* * * * *